(12) United States Patent
Nomura et al.

(10) Patent No.: US 6,546,534 B1
(45) Date of Patent: Apr. 8, 2003

(54) SEMICONDUCTOR INTEGRATED CIRCUIT DEVICE

(75) Inventors: Yoshinobu Nomura, Gunma (JP); Takao Saeki, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 190 days.

(21) Appl. No.: 09/610,767

(22) Filed: Jul. 6, 2000

(30) Foreign Application Priority Data

Jul. 6, 1999 (JP) .......................................... 11-192097
Jul. 13, 1999 (JP) .......................................... 11-199498

(51) Int. Cl.[7] ............................................. G06F 17/50
(52) U.S. Cl. ........................................... 716/10; 716/11
(58) Field of Search ........................... 716/7–11, 12–17, 716/1–2, 18

(56) References Cited

U.S. PATENT DOCUMENTS

| 5,410,173 A | * | 4/1995 | Kikushima et al. | 257/368 |
| 5,796,129 A | * | 8/1998 | Mizuno | 257/204 |
| 6,054,872 A | * | 4/2000 | Fudanuki et al. | 326/101 |
| 6,140,834 A | * | 10/2000 | Takahashi | 326/21 |

FOREIGN PATENT DOCUMENTS

JP          A-2-3952      1/1990

* cited by examiner

*Primary Examiner*—Matthew Smith
*Assistant Examiner*—Paul Dinh
(74) *Attorney, Agent, or Firm*—Fish & Richardson PC

(57) ABSTRACT

The development time of a linear SASIC is shortened. In a first block region 10 of a semiconductor chip 20, circuits of the non-master slice layout, or semiconductor elements are formed, and, in a second block region 11 surrounding the first block region, circuits of the master slice layout are placed.

13 Claims, 8 Drawing Sheets

SEMICONDUCTOR INTEGRATED CIRCUIT DEVICE

BACKGROUND OF THE INVENTION

1. Field of the Invention

The present invention relates to a semiconductor integrated circuit device, and particularly to an analog IC in which the development time can be shortened, the reliability can be improved, and the degree of freedom in design can be enhanced.

2. Description of the Related Art

Conventionally, ASICs are mainly configured by MOS devices, and realized in the form of a gate array, a master slice, or the like. Since a MOS device is mainly used in a digital circuit and such a circuit is formed by turning on/off a transistor, elements such as transistors and resistors are formed so as to have a substantially same size. Therefore, transistors, resistors, and other elements are repeatedly formed, and these elements are selected through interconnections to constitute a circuit, thereby realizing an IC.

A linear circuit, particularly, a BIP linear circuit consists of a plurality of electronic circuit blocks, and elements constituting the blocks have various characteristics and sizes. Even when semiconductor elements such as transistors, diodes, resistors, and capacitors are configured by selecting repeatedly formed elements as in the case of a gate array or a master slice, therefore, satisfactory characteristics cannot be obtained. Consequently, a countermeasure is taken as described below.

For example, JP-A-2-3952 (FIG. 9) discloses a technique as an example of such a countermeasure. The disclosed technique is a so-called building block layout in which a layout region for elements is formed into a rectangular shape, and a power source line and a ground line are disposed on both sides of each block. In the technique, all building blocks have the same size.

When an AM circuit is to be configured, the number of elements is first determined, and all the elements are distributed over layout regions of the same size.

Referring to FIG. 9, for example, two rows in each of which eight layout regions of the same size are laterally arranged are formed in an area of a semiconductor chip 30 surrounded by bonding pads 31. Among the layout regions, three layout regions constitute an electronic circuit block (for example, an AM circuit) indicated by A, three layout regions constitute an electronic circuit block indicated by B, two layout regions constitute an electronic circuit block indicated by C, five layout regions constitute an electronic circuit block indicated by D, and three layout regions constitute an electronic circuit block indicated by E.

In other words, the layout regions of the same size correspond to bricks, respectively, and the bricks are freely arranged in a rectangular IC, so that the layout regions are regularly placed.

When the electronic circuit block C is not necessary, the corresponding two layout regions are deleted, and the remaining layout regions are rearranged, so that another IC chip can be realized. When another electronic circuit block F is to be added, the layout regions including those constituting the new circuit block are rearranged in a similar manner as bricks.

A design technique for the layout will be described. In the case of an IC of an AM/FM circuit, for example, a necessary circuit library is first selected, and rectangular pattern libraries are formed in order to construct the selected circuit library in an IC chip by he building block layout, and then arranged in the IC chip. Thereafter, metal interconnects are formed so as to select all the pattern libraries, thereby configuring a first generation of an AM/FM IC serving as a parent production type.

When such a first generation IC is to be remodeled into another IC, an efficient layout of an IC chip must be considered. Therefore, it is required that an unnecessary circuit block is deleted or a necessary circuit block is added and blocks are efficiently rearranged on the IC chip.

Consequently, the user requesting such remodeling to be realized in a shorter design time is not satisfied with the proposed technique.

With respect to a necessary circuit block, the circuit design and the pattern design must be performed from the beginning, and hence a long design time is required. Such a newly developed circuit block involves at first various problems such as a parasitic effect, oscillation, and invasion of noises, and does not has guaranteed reliability. Improvements for solving the problems are required, and the pattern design must be repeated many times.

In the case where the user requests a short delivery time of a product, a master slice is employed. In a master slice also, however, the whole configuration is realized by selection of elements, and hence there is a problem in that the reliability is low.

SUMMARY OF THE INVENTION

According to the invention, first, the problems are solved by a configuration in which one region is formed as a region where a master slice is enabled, so as to facilitate the pattern design of an electronic circuit that is to be newly developed, and fundamental blocks that are frequently used are placed in another region.

Namely a first aspect of the present invention is a semiconductor integrated circuit device in which a semiconductor layer formed in a surface of a semiconductor chip is divided into a plurality of block regions serving as a layout region for an electronic circuit, a plurality of semiconductor elements constituting said electronic circuit mounted in said block regions, and interconnects are formed in an upper layer of and/or a periphery of said block regions in which said electronic circuit is formed, wherein
said block regions are divided into a master slice region which is configured by selecting or unselecting elements, and a fixed region in which substantially all of elements are selected to configure one circuit.

When a part of the above-mentioned electronic circuit is configured by using the fundamental blocks, it is possible to improve the reliability. The use of the fundamental blocks facilitates improvement of the electronic circuit, and expansion of product types.

Second, in a building block layout in which the longitudinal length is standardized and the lateral length is flexibly set, circuits of different sizes are configured in each block region, and hence block regions have different sizes. In a semiconductor chip, consequently, a vacant region is inevitably produced. Fundamental blocks are positively accommodated in such a vacant region, so that modification of a circuit and expansion of product types are facilitated.

Third, in a building block layout in which both the longitudinal and lateral lengths are standardized, fundamental blocks are positively accommodated in a vacant region in the same manner as described above, so that modification of a circuit and expansion of product types are facilitated.

Each fundamental block may be configured by a differential circuit, an op-amp, a comparator, a frequency converter, a multiplier, a reference voltage source, an analog switch, or the like.

Fifth, the problems can be solved by a configuration in which a first block region where an electronic circuit block and/or a semiconductor element that is particularly accurate in an electronic circuit is placed is formed in a substantial center of a semiconductor chip.

In order to improve the design speed, a master slice layout is employed. At present, the position where a resistor which defines the oscillation frequency is to be placed depends largely on a design software. Therefore, such a resistor or an electronic circuit block is determined so as to be placed in the center of a semiconductor chip, whereby resin distortion after packaging, and wafer distortion due to the resin distortion are eliminated as far as possible.

When a region other than the first block region is used as that where the master slice layout is employed, therefore, the configuration except an important circuit (a circuit in which variations of characteristics are not desired) can be realized by selection and unselection of elements. As a result, shortening of the design time, and prevention of variations of circuit characteristics can be realized.

When an oscillation circuit which is to be fixed to a specific frequency is placed in the first block region, particularly, it is possible to prevent the fixed frequency from fluctuating.

When the semiconductor element formed in the first block region is a resistor, variations of the resistance can be suppressed.

DESCRIPTION OF THE PREFERRED EMBODIMENT

Hereinafter, embodiments of the invention will be described. The invention relates particularly to a bipolar linear circuit.

Figure 1:
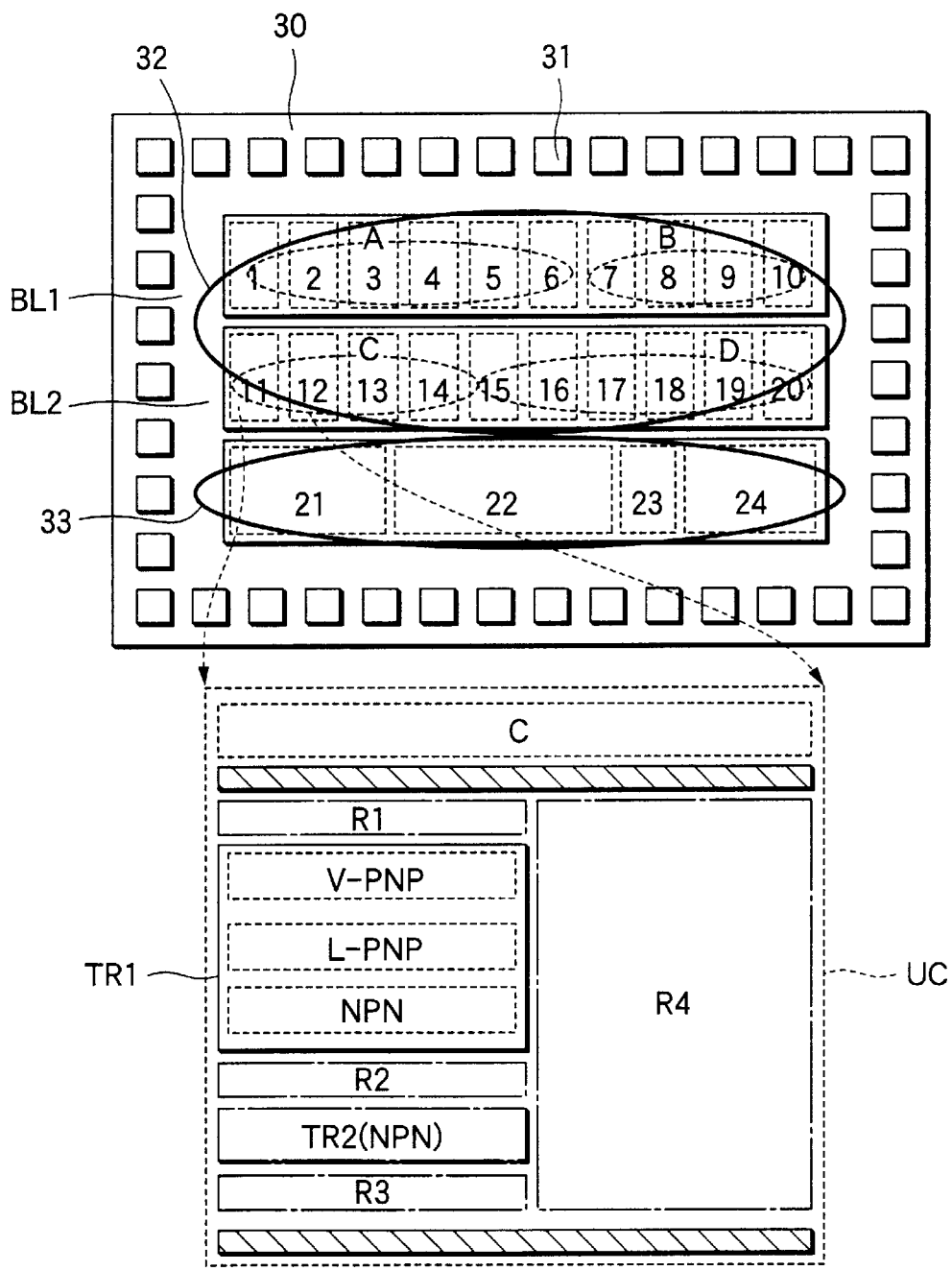
FIG. 1 is a plan view of a semiconductor integrated circuit device which is a first embodiment of the invention.

In FIG. 1, a rectangle indicated by a solid line which is in the outermost side shows a semiconductor IC (semiconductor chip) 30. Bonding pads 31 are formed in the periphery of the rectangle. The substantially rectangular region which is surrounded by the formation region of the bonding pads 31 serves as a layout region for electronic circuit blocks, and also as a formation region for elements. Sometimes, protection diodes or the like are built in below the bonding pads. However, the number of such diodes is very small from the viewpoint of the ratios of the numbers of the elements, and hence such diodes or the like are neglected. The bonding pads 31 include at least one power source pad, and at least one GND pad.

The rectangular region is divided into, for example, a plurality of block rows (in the embodiment, two lateral rows BL1 and BL2). Each of the block rows is divided into a plurality of block regions. For example, the first block row BL1 is configured by block regions 1 to 10, and the second block row BL2 is configured by block regions 11 to 20.

The block regions 1 to 20 constitute a master slice region 32. As shown in an enlarged view (the lower side of FIG. 1) indicated by the arrows, each of the block regions consists of a basic unit cell UC. The unit cell UC is a cell of the so-called master slice layout, and elements are built in the form of groups so as to be selectable in accordance with a circuit diagram.

Specifically, a plurality of kinds of resistors R1, R2, R3, and R4 of different values are selected and arranged in respective groups. Transistors Tr1 and Tr2, and capacitors C are configured in the same manner. In the figure, with respect to the transistors Tr, particularly, three types of transistors, or vertical and lateral PNP-Tr, and vertical NPN-Tr are arranged in respective groups.

In the above, the arrangement manner and number of the block rows have been exemplarily described, and are not restricted to the examples. Diodes or other elements may be disposed in addition to the transistors and the capacitors serving as elements in each block region.

The elements of different sizes (the terms of different sizes mean: with respect to the resistors, different resistances; with respect to the transistors, different current capacities; and, with respect to the capacitors, different capacitances) are grouped in rows. However, it is not required that all the elements have different sizes.

Sometimes, protection diodes or the like are built in below the bonding pads. In the embodiment, the number of such diodes is very small from the viewpoint of the ratios of the numbers of the elements, and hence such diodes or the like are neglected. The bonding pads 31 include at least one power source pad, and at least one GND pad.

In the semiconductor chip 30 of FIG. 1, a plurality of electronic circuit blocks are prepared as described in the example of the conventional art, and electrically. connected to one another so as to realize one IC circuit. Each electronic circuit block is configured by selecting elements in the block regions in accordance with a circuit diagram, and consists of at least one block.

For example, an electronic circuit block A is configured by the block regions 1 to 6, an electronic circuit block B is configured by the block regions 7 to 10, an electronic circuit block C is configured by the block regions 11 to 14, and an electronic circuit block D is configured by the block regions 15 to 20.

By contrast, block regions 21 to 24 constitute a region which is not a master slice region, and into which a circuit block wherein characteristics and the circuit pattern have been already determined is to be placed (hereinafter, such a circuit block is referred to as "fundamental block"). In the embodiment, at least one kind of a frequency converter, an oscillator, a differential amplifier, a level detection circuit, an op-amp, a comparator, a multiplier, an attenuator, a current driver, an ECL, a reference voltage source, an analog switch, a phase comparator, and the like is selected as the fundamental block. The selected fundamental block may be singular or plural.

The semiconductor chip 30 according to the invention is fundamentally an IC of the master slice layout, and substantially all circuits can be configured by selection and unselection of elements in the block regions 1 to 20. However, many electronic circuits employ the above-mentioned fundamental blocks. When such a fundamental block is configured, the block regions 21 to 24 formed in the fundamental block region 33 are selected.

The fundamental blocks are previously produced as libraries, and the circuit design and the pattern design have high reliability. According to the invention, the reliability of an IC can be improved by the use of such fundamental blocks.

An electronic circuit configured by the electronic circuit blocks A to D may be developed as a parent production type, and the circuit may be then expanded to child production types. Also in this case, the expansion can be performed by using the fundamental blocks. Unlike the master slice layout in which all elements are to be selected, therefore, the reliability is enhanced.

Figure 9:
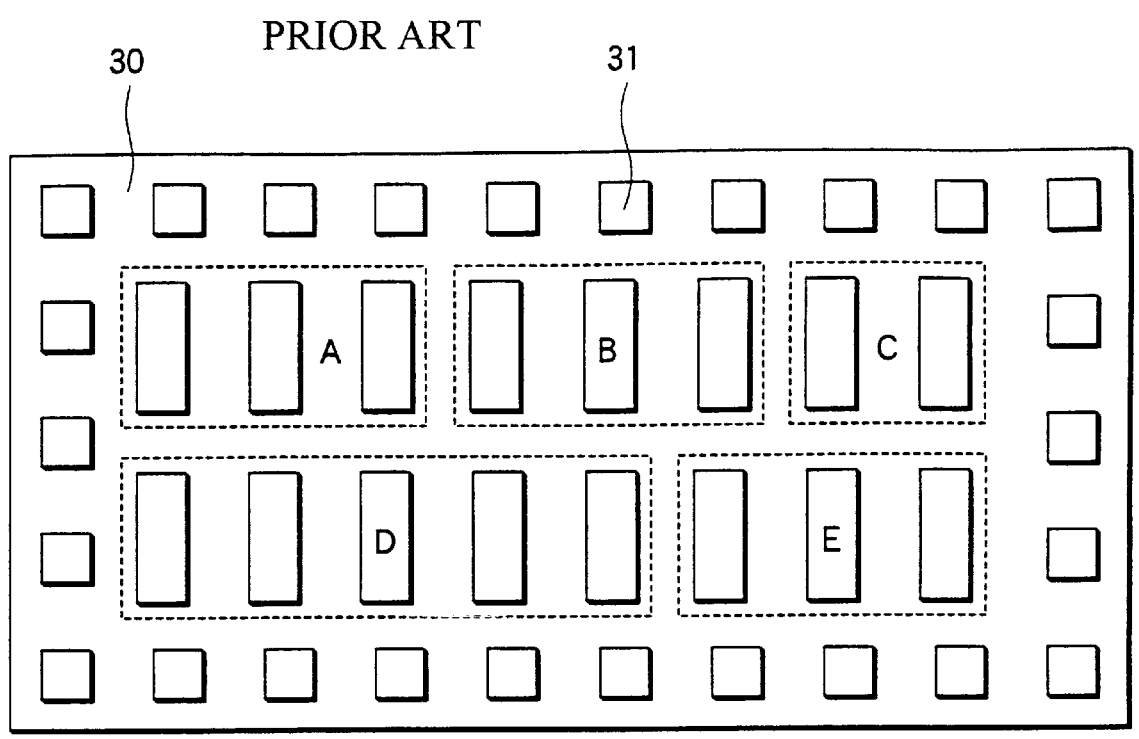
FIG. 9 is a view illustrating a semiconductor integrated circuit device of the conventional art.

Next, a second embodiment will be described with reference to FIGS. 2 and 9. In the embodiment, the building block layout is employed. In FIG. 9, as described also in the example of the conventional art, both the longitudinal and lateral lengths of block regions are standardized, and each of the electronic circuit blocks A to E is configured by a plurality of block regions. Since the block regions have the same size as in the case of bricks, the block regions can be regularly placed in a chip.

Figure 2:
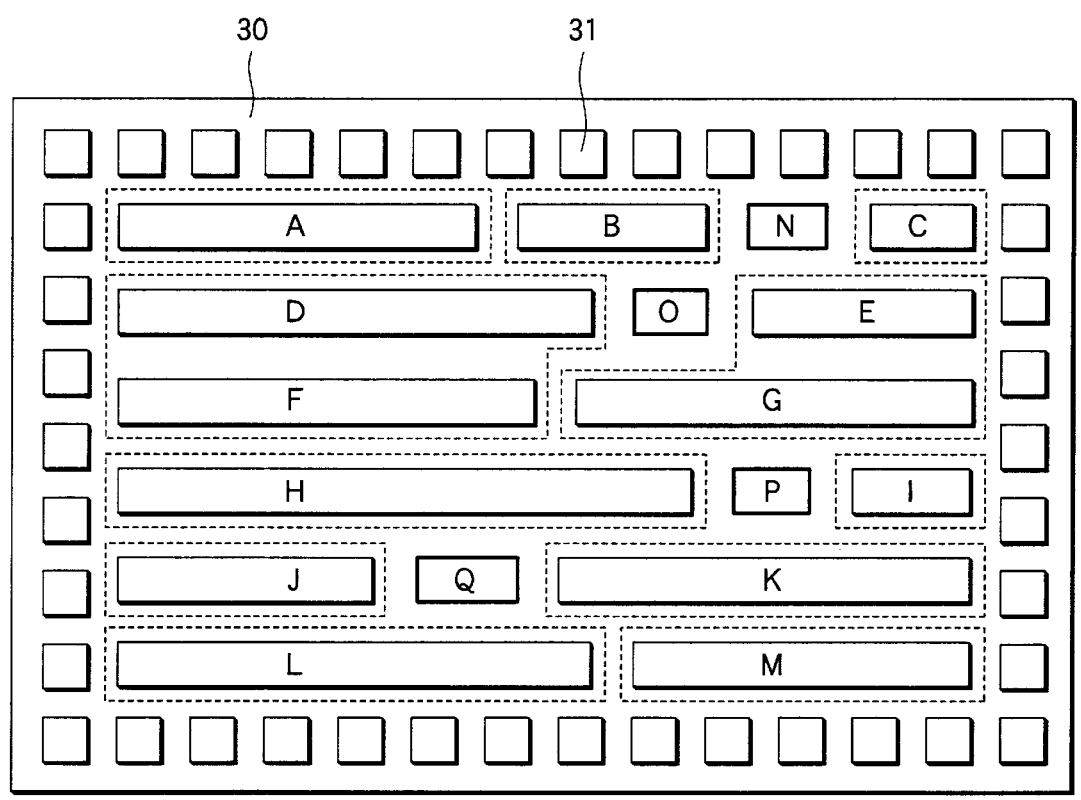
FIG. 2 is a plan view of the semiconductor integrated circuit device which is the second embodiment of the invention.

By contrast, in FIG. 2, the longitudinal lengths are standardized, and the lateral lengths are different from one another depending on the sizes of the electronic circuit blocks A to M. In FIG. 9, each electronic circuit block is configured by a plurality of block regions, and, in FIG. 2, each electronic circuit block is configured by one block region while changing the lateral length.

In both the cases, although arrangement in a chip is easily performed, a vacant region is inevitably produced. In FIG. 9, when the circuit is to be configured by deleting the electronic circuit block E, one block region becomes vacant because the deleted block has three block regions. In FIG. 2, since the lateral lengths of the block regions are different from one another, vacant regions N to Q which are rectangular regions indicated by the thick lines are inevitably produced.

In the invention, the above-described fundamental blocks are placed in the vacant region to be used in modification of a circuit and expansion of product types. Fundamental blocks which are expected to be used in expansion of product types or required in modification of a circuit are previously placed in the region. Even after the pattern is determined, therefore, modification of a circuit and expansion of product types are enabled by selecting the fundamental blocks.

As described above, the disposition of fundamental blocks enables modification of a circuit and expansion of product types to be easily performed without requiring fundamental blocks to be separately designed. Therefore, the design time can be shortened.

For example, as shown in FIG. 9 FE(front end)circuit and IE(intermediate frequency)circuit which are eager to interfere with each other, and should be made separate each other, are placed at regions A and E, and other circuit regions are formed as master sliced portion. Regions A and E are positioned at end portions of diagonal line of the semiconductor chip.

In all the embodiments described above, the fundamental blocks may be placed so as to be scattered to arbitrary positions in place of a specific position. In FIG. 1, particularly, all the fundamental blocks are collectively placed in the specific region, and hence interconnections for connecting the fundamental blocks with predetermined electronic circuit blocks are complicated. When the fundamental blocks are scattered, the complexity of interconnections may be sometimes reduced.

When the specific region is placed between block rows, interconnections for selection can be simplified for either of the rows.

Hereinafter, a third embodiment of the invention will be described. The invention relates particularly to a bipolar linear circuit.

First, a usual IC and an IC in which the master slice layout is employed are defined to clarify the difference therebetween. A usual IC is a device in which only elements that are necessary for configuring an electronic circuit to be mounted are formed substantially in the IC, and substantially all of the elements are selected by interconnections. The expression " . . . formed substantially in the IC, . . . substantially all of the elements are selected" is used in the above because also elements for TEG, and the like which are not required in the electronic circuit are placed in the IC.

By contrast, in an IC of the master slice layout, elements which are necessary for realizing various circuits are formed in the IC, and the elements are selected or unselected in accordance with a desired electronic circuit, thereby configuring the circuit. Therefore, certain elements in the IC are selected, and the other elements remain in the IC to be unselected.

The above is applicable also to a block region constituting an electronic circuit block. In a usual block region, substantially all of the elements are those to be selected. In a block region in which the master slice layout is employed, selected elements coexist with unselected elements. Hereinafter, the latter is called the master slice layout, and the former is called the non-master slice layout.

Figure 3:
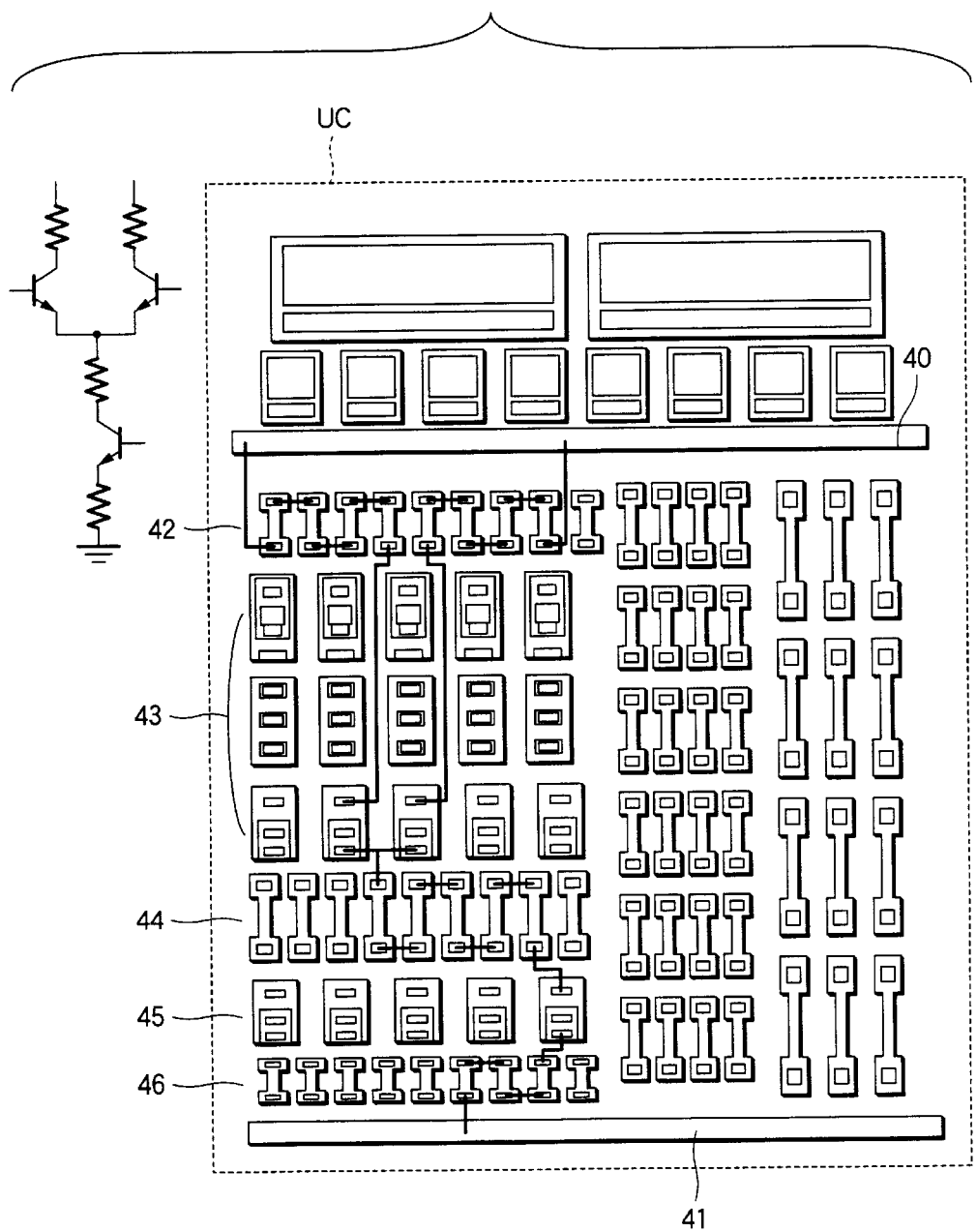
FIG. 3 is a view illustrating an example of a unit cell.

As described above, in the master slice layout, as shown in FIG. 3, specific kinds of semiconductor elements are repeatedly formed into row-like groups in an IC. Some of the elements are selected by means of interconnections to form a circuit. Among the elements, there are ones which are selected by means of interconnections, and ones which are not selected. Therefore, the mounting efficiency is poor. In the case of a bipolar type, however, a circuit can be realized only by a pattern of interconnections, and without preparing patterns (patterns required for photolithography) for layers ranging from a buried layer to an emitter diffusion layer. Consequently, the design speed is high. When a problem arises after completion of a device, however, portions which easily malfunction or produce noises must be checked, and placement of interconnections must be modified.

In the case where an oscillation circuit is to be configured by the master slice layout, for example, the patterning is automatically performed by a computer program for designing a pattern, but positions of critical portions, in this example, a capacitor and a resistor which determine the oscillation frequency cannot be known before completion.

In the master slice layout, selected elements coexist with unselected elements, and hence the resulting chip size is very larger than that of a usual IC chip.

Even in an ordinary IC, warpage of a large magnitude is caused in the periphery of the chip by distortion with respect to a resin. In the master slice layout, when the oscillation circuit or the resistor is placed in the periphery of a semiconductor chip, the distortion is made greater by the increased size of the chip, so that the oscillation frequency and the resistance are largely changed.

By contrast, the non-master slice layout is realized by preparing patterns for layers ranging from a buried layer to an emitter diffusion layer, for each IC device type, advancing the production process by using the patterns, and finally selecting substantially all of elements by an interconnection pattern. Therefore, the design time is long. Also in this layout, after interconnections are formed, checks are conducted about,for example, whether the ability as an IC is satisfactory, whether it easily malfunctions, and whether it is a noise source. If there is a problem, the layers and the placement of the interconnections must be modified. When improvement is finally conducted and the device pattern is once determined, however, the quality is substantially guaranteed even if the device pattern is employed at any number of times in other IC. Since there is no unselected element, the element mounting efficiency is high.

In other words, in the non-master slice layout, when an IC (semiconductor chip 20) is once completed, the mounting efficiency is high, and the quality as an electronic circuit is guaranteed. This is applicable also to electronic circuit blocks constituting an electronic circuit. The quality of each electronic circuit block is guaranteed with respect to both a circuit and a pattern. Data of the circuits and patterns are stored in the form of a circuit library and a pattern library. This means that, in a chip, the area occupied by an electronic circuit or electronic circuit blocks constituting the circuit is narrowed.

According to the invention, the master slice layout is employed to realize improvement of the design speed, and, at the same time, a pattern library in which the quality has been established as electronic circuit blocks employing the non-master slice layout is used.

Figure 4:
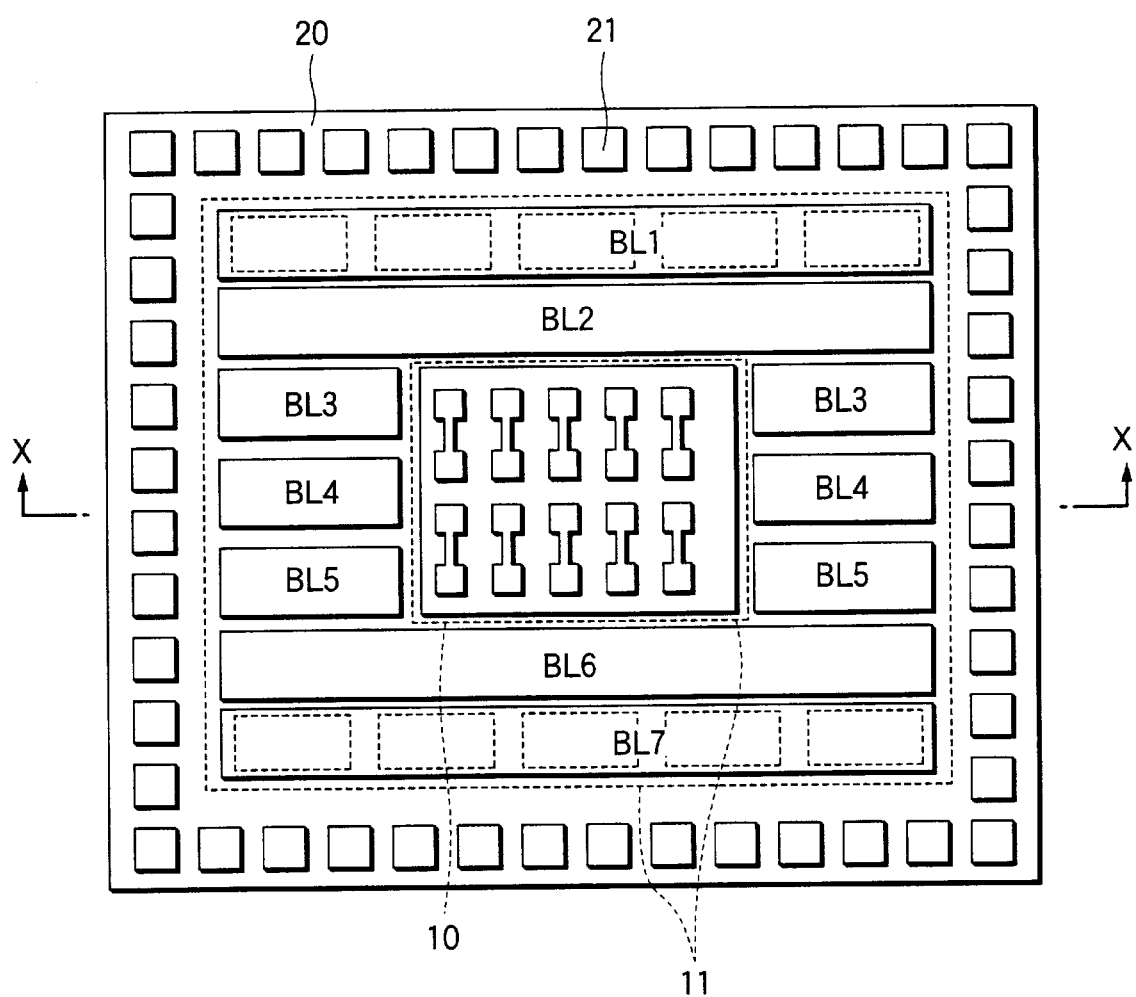
FIG. 4 is a plan view illustrating a semiconductor integrated circuit device which is a third embodiment of the invention.

Referring to FIG. 4, electronic circuit blocks which are configured by the non-master slice layout and in which variations of characteristics are not desired are formed in a first block region 10, and other electronic circuit blocks are formed by the master slice layout and placed in a second block region 11.

Since the first block region 10 is configured by the non-master slice layout, the occupation area rate in an IC chip can be reduced. Moreover, the small-sized electronic circuit blocks can be placed in a substantial center of the chip. Therefore, variations of characteristics can be significantly suppressed.

Figure 5:
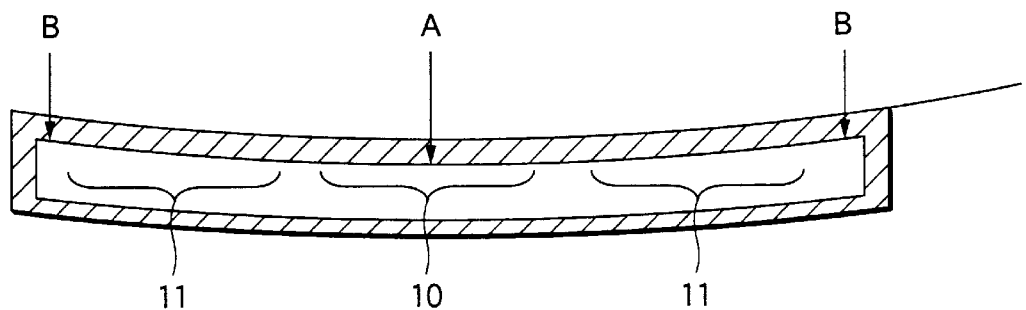
FIG. 5 is a view illustrating warpage in the semiconductor integrated circuit device of the invention.

This will be described with reference to FIG. 5 by means of warpage after packaging. When the master slice layout is employed, the magnitude of warpage of the chip in the area extending from the arrow A to the arrows B is made large by the increased chip size, but, in the area in the vicinity of the arrow A, the magnitude of warpage is small. When an oscillation circuit and the like are placed in the first block region 10, therefore, variations of characteristics of the circuits can be suppressed. Since the pattern in the region is formed by using the non-master slice layout, the pattern area is smaller than the area of a pattern which is formed by using the master slice layout. Consequently, variations of characteristics of the circuits can be further suppressed.

The master slice region 11 in FIG. 4 is divided into, for example, a plurality of block rows (in the embodiment, ten lateral rows BL1 to BL7). Each of the block rows is divided into a plurality of block regions. For example, the first block row BL1 is configured by block regions 1 to 5. The second and subsequent block rows BL2 to BL7 are configured in a similar manner.

Figure 6:
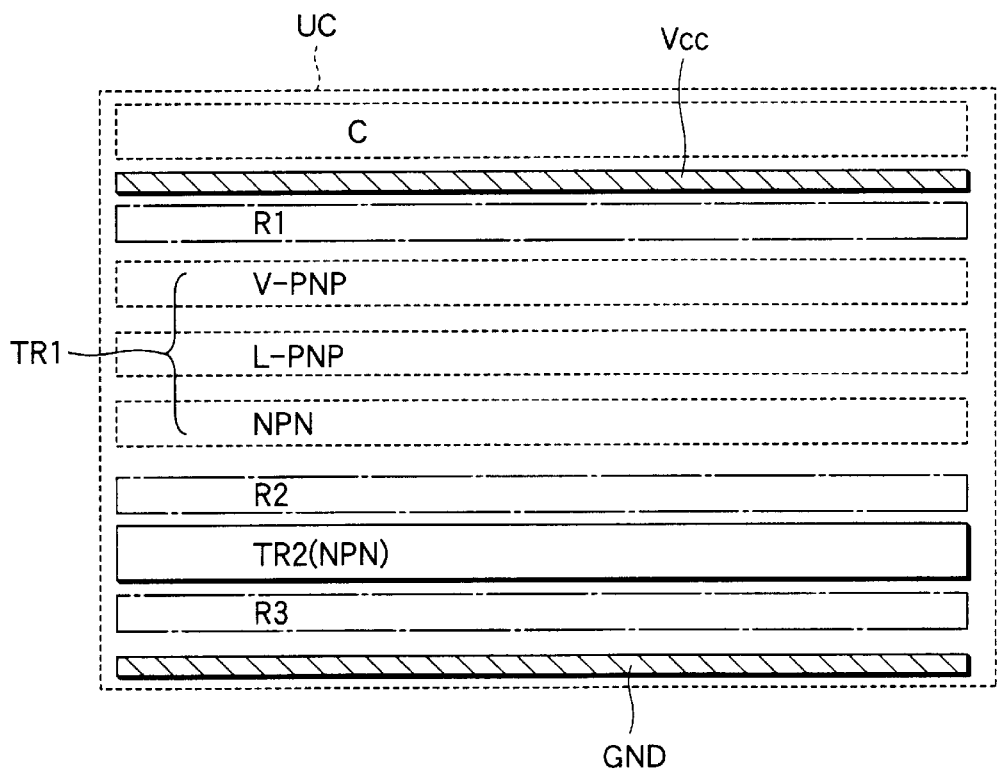
FIG. 6 is a view illustrating a unit cell.

Each of the block regions consists of a basic unit cell UC shown in FIG. 6. The unit cell UC is shown as an example, and is a cell of the so-called master slice layout, and elements are built in the form of groups so as to be selectable in accordance with a circuit diagram.

Specifically, a plurality of kinds of resistors R1, R2, and R3 of different values are selectively prepared and then arranged in respective groups. Transistors Tr1 and Tr2, and capacitors C are configured in the same manner. In the figure, with respect to the transistors Tr, particularly, three types of transistors, or vertical and lateral PNP-Tr, and vertical NPN-Tr are arranged in respective groups.

In the above, the arrangement manner and number of the block rows have been exemplarily described, and are not restricted to the examples. Diodes or other elements may be disposed in addition to the transistors and the capacitors serving as elements in each block region.

The elements of different sizes (the terms of different sizes mean: with respect to the resistors, different resistances; with respect to the transistors, different current capacities; and, with respect to the capacitors, different capacitances) are grouped in rows. However, it is not required that the elements are different from one another in row-by-row.

A linear circuit often uses a circuit shown in the left side of FIG. 3. In the invention, therefore, the unit cells are designed on the basis of this circuit. In the direction from a VCC line 40 to a GND line 41, namely, a first resistor group 42, a first transistor group 43, a second resistor group 44, a second transistor group 45, and a third resistor group 46 are arranged.

In this example, the circuit shown in the left side is selected by means of interconnections.

As seen from the figure, in the portions where interconnections are not formed, elements are not selected, and, in the portions where interconnections are formed, elements are selected.

Figure 7:
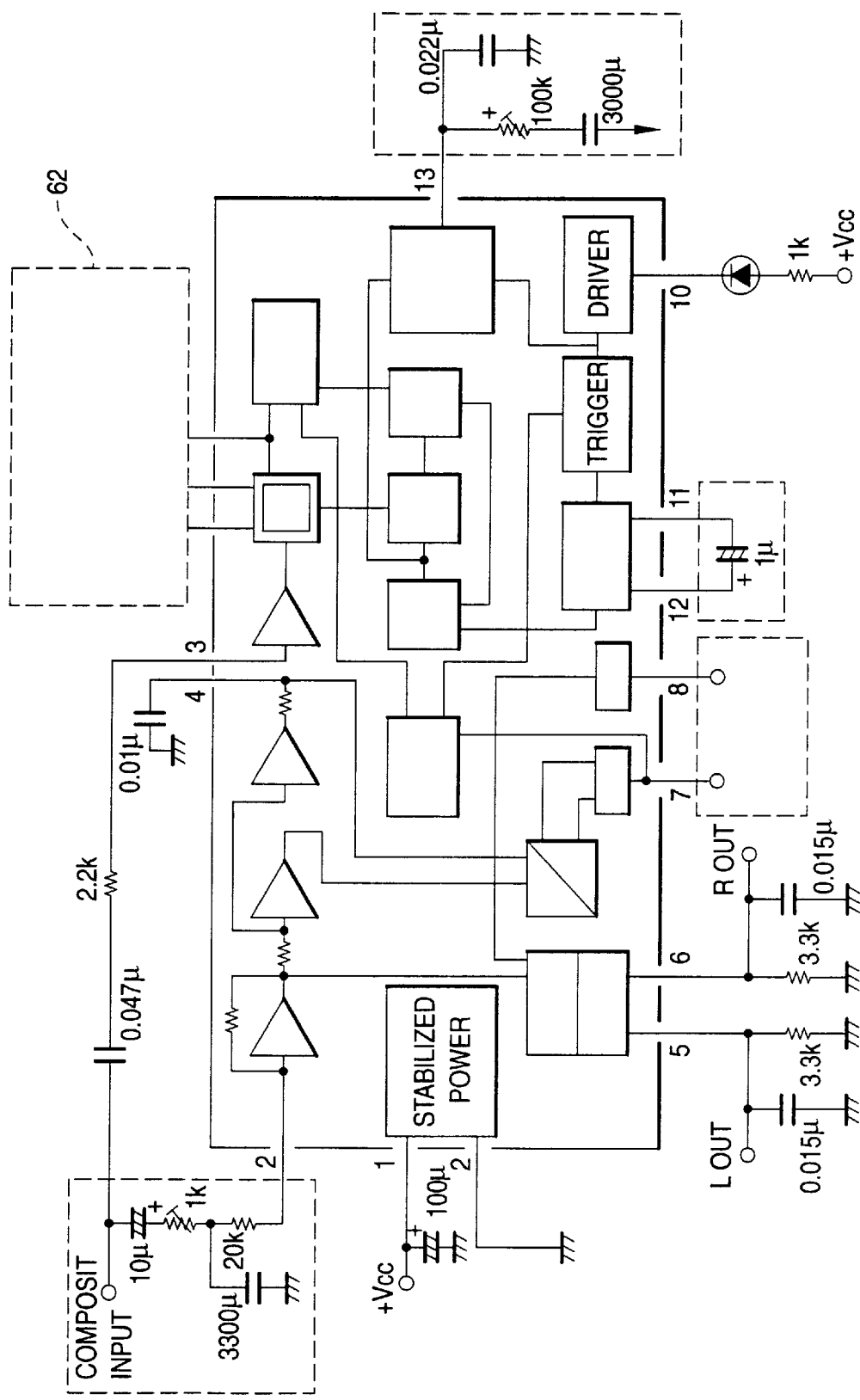
FIG. 7 is a stereo detecting circuit of a tuning device
Figure 8:
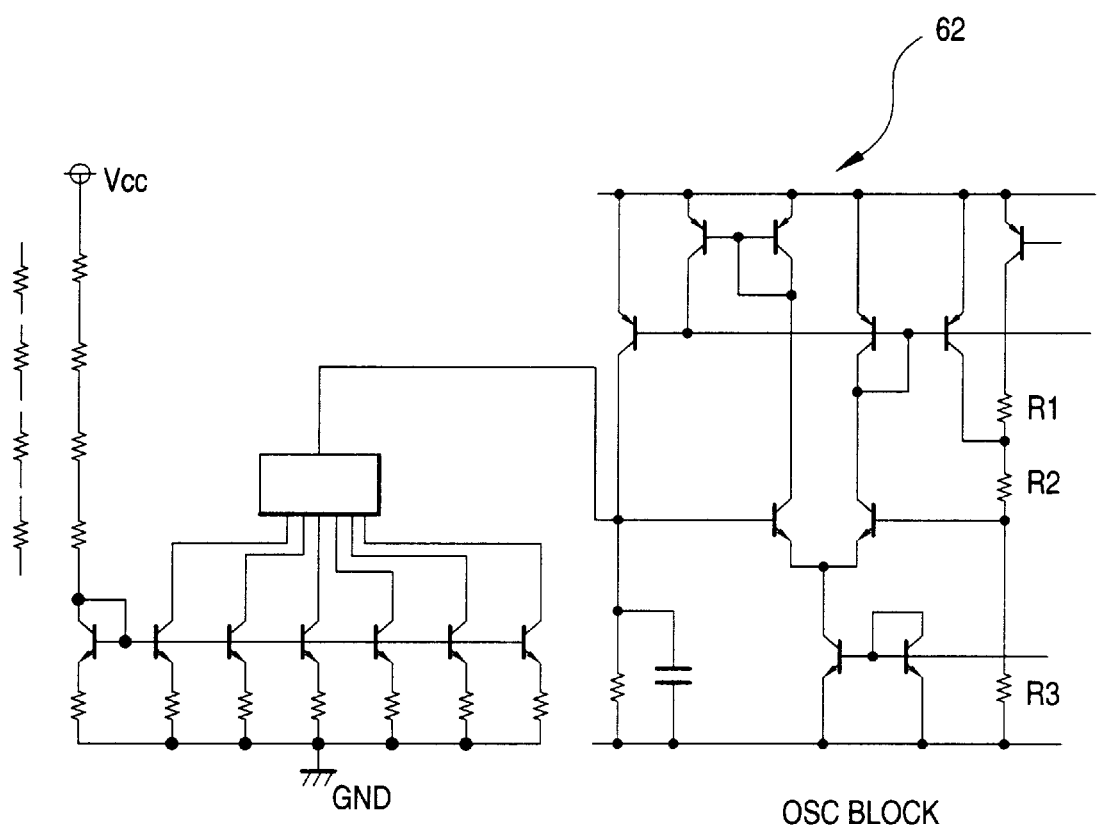
FIG. 8 is a sapping circuit of the stereo detecting circuit.

For example, according to the semiconductor integrated circuit of the present invention, as shown in FIGS. 7 and 8, stereo detecting circuit of a tuning device integrated with oscillating circuit, can be obtained. A sapping circuit 62 is usually used so as to control a fluctuation of an oscillating frequency. The sapping circuit 62 is controlled so as to obtain an appropriate oscillation frequency within a range of applicable frequency, by changing a resistivity and changing an inner time constant. The circuit is checked in a state of wafer.

However, in a conventional device, resistivity in the sapping circuit is changed by thermal stress caused by heat in molding step. Even if resistivity is controlled at a wafer stage, the frequency is changed after being molded. Therefore it was difficult to integrate an oscillating circuit. Contrary that, in a case of an integrated circuit chip in which all circuits surrounded by dotted line are integrated in FIG.8, the sapping circuit as shown in FIGs, 7 and 8, is located in a center of the integrated circuit chip. Therefore, even if the integrated circuit chip is heated in the molding step, reliability can be maintained without change of oscillating frequency.

According to the invention, the pattern design of an electronic circuit that is to be newly developed is facilitated by one region where a master slice is enabled, and fundamental blocks that are frequently used are placed in another region, whereby a part of the electronic circuit is enabled to be configured by using the fundamental blocks. Therefore, it is possible to improve the reliability. The use of the fundamental blocks produces an advantage that improvement of the electronic circuit, and expansion of product types are facilitated.

In the building block layout in which the longitudinal length is standardized and the lateral length is flexibly set, circuits of different sizes are configured in each block region, and hence block regions have different sizes. In a semiconductor chip, consequently, a vacant region is inevitably produced. According to the invention, such a vacant region is positively used as a layout region for fundamental blocks, whereby modification of a circuit and expansion of product types can be easily realized.

In the building block layout in which both the longitudinal and lateral lengths are standardized, fundamental blocks are positively accommodated in a vacant region, whereby modification of a circuit and expansion of product types can be easily realized.

In ASICs of the master slice layout, the building block layout, or the like, therefore, it is possible to realize a semiconductor integrated circuit. device in which the reliability can be improved, the design time can be shortened, and expansion of product types can be easily performed.

According to the invention, a first block region where an electronic circuit block and/or a semiconductor element that is particularly accurate in an electronic circuit is placed in a substantial center of a semiconductor chip, whereby variations of characteristics of the electronic circuit block and/or the semiconductor element can be prevented from occurring.

In the case where, in order to improve the design speed, a master slice layout is employed, at present, the position where a resistor which defines the oscillation frequency is to be placed depends largely on a design software. When such a resistor or an electronic circuit block is determined so as to be placed in the center of a semiconductor chip, therefore, resin distortion after packaging, and wafer distortion due to the resin distortion can be eliminated as far as possible.

When a region other than the first block region is used as that where the master slice layout is employed, therefore, the configuration except an important circuit (a circuit in which variations of characteristics are not desired) can be realized by selection and unselection of elements. As a result, shortening of the design time, and prevention of variations of circuit characteristics of the important circuit can be realized.

When an oscillation circuit which is to be fixed to a specific frequency is placed in the first block region, particularly, it is possible to prevent the fixed frequency from fluctuating.

When the semiconductor element formed in the first block region is a resistor, variations of the resistance can be suppressed.

In ASICs of the master slice layout, therefore, it is possible to realize a semiconductor integrated circuit device in which the reliability can be improved and the design time can be shortened.

What is claimed is:

1. A semiconductor integrated circuit device comprising:
   a semiconductor chip;
   a semiconductor layer disposed on said semiconductor chip;
   a plurality of block regions in the semiconductor layer, serving as a layout for an electronic circuit;
   a plurality of semiconductor elements in said block regions; and
   interconnects formed in an upper layer of and/or a periphery of said block regions,
   wherein a group of said block regions comprises a master slice region which is configured by selecting or unselecting the semiconductor elements in the master slice region, and
   another group of said block regions comprises a fixed region having a predetermined, connected circuit pattern, and said fixed region comprises a plurality of regions located separately from each other.

2. A semiconductor integrated circuit device according to claim 1, further comprising:
   an electronic circuit block comprising one of the block regions selected to form an electronic circuit,
   wherein said electronic circuit block has a standardized longitudinal length and a variable lateral length, and the fixed block is disposed in a region non-overlapping with said electronic circuit block.

3. A semiconductor integrated circuit device according to claim 1, wherein said fixed region comprises a differential circuit, an op-amp, a comparator, a frequency converter, a multiplier, a reference voltage source, or an analog switch.

4. A semiconductor integrated circuit device according to claim 1, wherein said fixed region comprises a front end circuit and an intermediate frequency circuit which are located separately from each other at ends of the semiconductor chip.

5. A semiconductor integrated circuit device comprising:
   a semiconductor chip;
   a semiconductor layer disposed on said semiconductor chip;
   a plurality of block regions in the semiconductor layer, serving as a layout for an electronic circuit, each of said block regions having standardized longitudinal and variable lateral lengths;
   a plurality of semiconductor elements in said block regions; and
   interconnects formed in an upper layer of and/or a periphery of said block regions;
   wherein a group of said block regions comprises an electronic circuit block which is configured by selecting or unselecting the semiconductor elements in the electronic circuit block;
   and another group of said block regions comprises fixed blocks having a predetermined, connected circuit pattern and disposed separately in a region non-overlapping with the electronic circuit block.

6. A semiconductor integrated circuit device comprising:
   a semiconductor chip;
   a semiconductor layer disposed on said semiconductor chip;
   a plurality of block regions in the semiconductor layer, serving as a layout for an electronic circuit
   a plurality of semiconductor elements in said block regions; and
   interconnects formed in an upper layer of and/or a periphery of said block regions in which said electronic circuit is formed,
   wherein a group of said block regions comprises a master slice region which is configured by selecting or unselecting the semiconductor elements in the master slice region, and one of said block regions comprises a first block region of a non-master slice layout, and said first block region is disposed substantially in the center of said semiconductor chip.

7. A semiconductor integrated circuit device according to claim 6, wherein said first block region has a characteristic susceptible to change if stress is induced on the first block region.

8. A semiconductor integrated circuit device according to claim 6, wherein said electronic circuit comprises an analog circuit, and the master slice region surrounds said first block region.

9. A semiconductor integrated circuit device according to claim 6, wherein said electronic circuit comprises an analog circuit, and an electronic circuit block formed in said first block region comprises an oscillation circuit which is fixed to a specific frequency.

10. A semiconductor integrated circuit device according to claim 6, wherein said semiconductor element formed in said first block region comprises a resistor.

11. A semiconductor integrated circuit device comprising:
a plurality of block regions disposed in a semiconductor layer formed on a surface of a semiconductor chip, said block regions serving as a layout region for an analog electronic circuit;
said block regions comprising:
a first block region which is disposed substantially in the center of said semiconductor chip and in which a highly reliable electronic circuit block and/or semiconductor elements are placed;
a second block region which is disposed to surround said first block region, said second block region employing a master slice layout which is configured by selecting or unselecting semiconductor elements in the master slice layout;
first interconnections through which substantially all of the semiconductor elements formed in said first block region are connected; and
second interconnections through which the semiconductor elements formed in said second block region are selected or unselected.

12. A semiconductor integrated circuit device according to claim 11, wherein said first block region comprises a sapping circuit comprising a resistor and capacitor.

13. A semiconductor integrated circuit device according to claim 11, wherein the semiconductor integrated circuit device comprises a stereo detecting circuit of a tuning device.

* * * * *